United States Patent [19]

Lee et al.

[11] Patent Number: 4,670,297
[45] Date of Patent: Jun. 2, 1987

[54] EVAPORATED THICK METAL AND AIRBRIDGE INTERCONNECTS AND METHOD OF MANUFACTURE

[75] Inventors: Kyu-Woong Lee, Arlington; Mark S. Durschlag, Natick; John Day, Lexington, all of Mass.

[73] Assignee: Raytheon Company, Lexington, Mass.

[21] Appl. No.: 747,518

[22] Filed: Jun. 21, 1985

[51] Int. Cl.$^4$ .................... H01L 21/88; H01L 21/312
[52] U.S. Cl. ........................................ 427/91; 427/99; 430/312
[58] Field of Search ...................... 427/91, 99; 430/312

[56] References Cited

U.S. PATENT DOCUMENTS

| | | | |
|---|---|---|---|
| 4,054,484 | 10/1977 | Lesh | 427/91 |
| 4,200,975 | 5/1980 | Debiec | 427/96 |
| 4,289,846 | 9/1981 | Parks | 427/89 |
| 4,436,766 | 3/1984 | Williams | 427/96 |
| 4,526,859 | 7/1985 | Christensen | 430/314 |
| 4,533,624 | 8/1985 | Sheppard | 430/314 |
| 4,536,421 | 8/1985 | Matsuzawa | 430/314 |
| 4,567,132 | 1/1986 | Fredericks | 430/312 |
| 4,568,411 | 2/1986 | Martin | 430/314 |

OTHER PUBLICATIONS

"Portable Conformable Mask-A Hybrid Near-Ultraviolet and Deep-Ultraviolet Patterning Technique" by B. J. Lin, SPIE vol. 174 Developments in Semiconductor Microlithography IV (1979), pp. 114–121.
Patent application Ser. No. 388,841, filed Jun. 16, 1982, inventor Walter Fabian, assigned to Raytheon Company, to be issued into U.S. Pat. No. 4,525,919 on Jul. 2, 1985.

Primary Examiner—John D. Smith
Attorney, Agent, or Firm—Denis G. Maloney; Richard M. Sharkansky

[57] ABSTRACT

A first masking layer of a first resist is provided over a semiconductor substrate and is patterned in a selected region to provide a masked region over which an airbridge interconnect will be provided. A second relatively thick layer of a second, different type of resist and a third relatively thin layer of resist are provided, respectively, over the substrate. The second and third layers of resist are patterned to provide an aperture having overhanging portions exposing the previously applied patterned regions of the first layer, and selected adjacent portions of the substrate. The second and third layers may also be patterned to provide a region for a patterned strip conductor. A stream of evaporated metal is directed towards the substrate and deposited within the apertures to provide an airbridge interconnect conductor and patterned strip conductor. The overhanging portions of the apertures provide separation between the metal layer deposited within the aperture and the metal layer deposited over the third masking layer, allowing the second and third masking layers to be lifted-off without disturbing the conductors. The masked regions underlying the bridges are also removed leaving the airbridge interconnect and patterned strip conductor.

7 Claims, 20 Drawing Figures

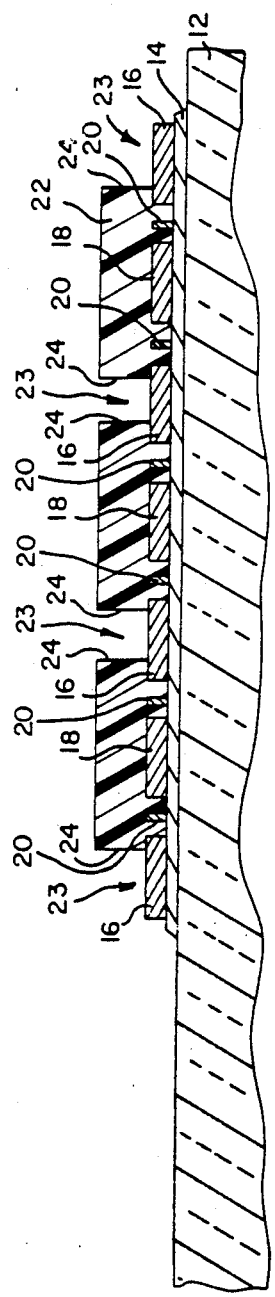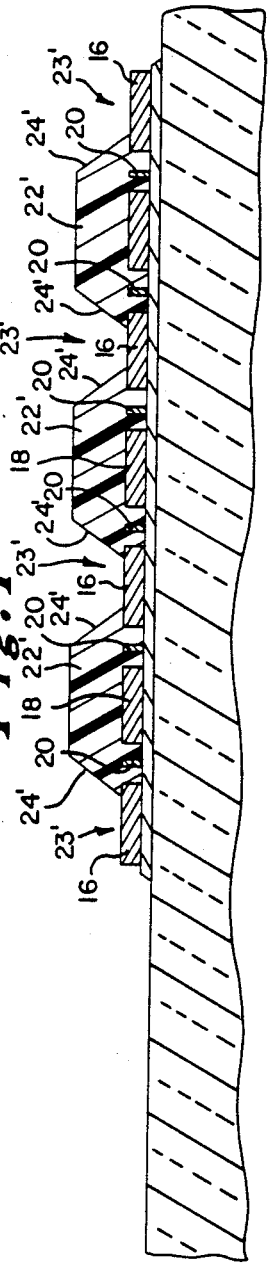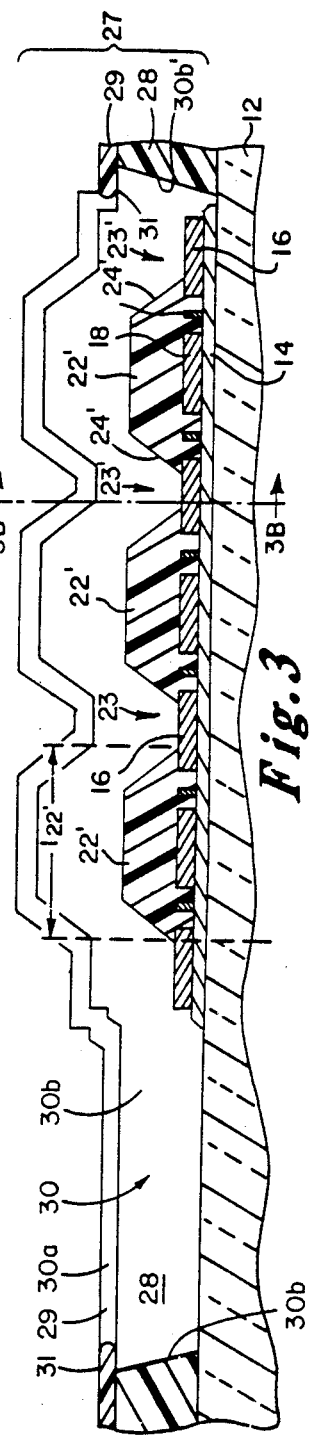

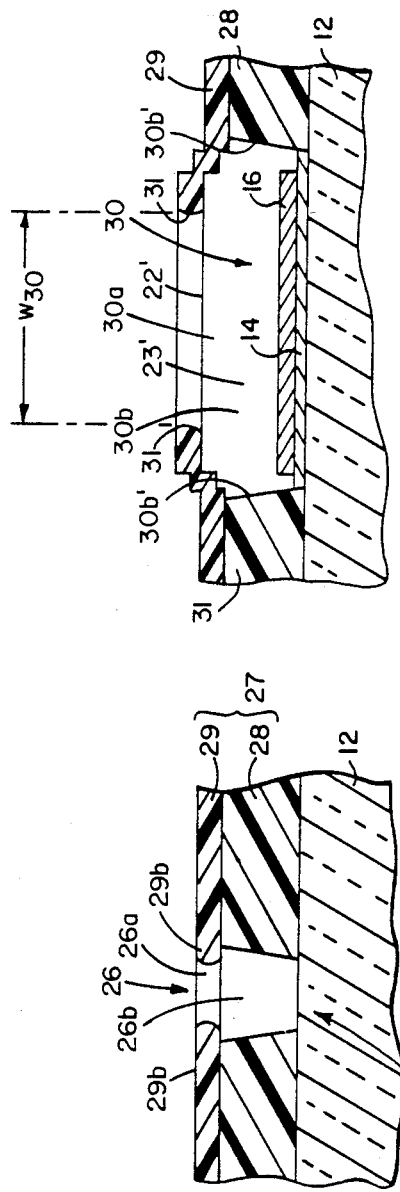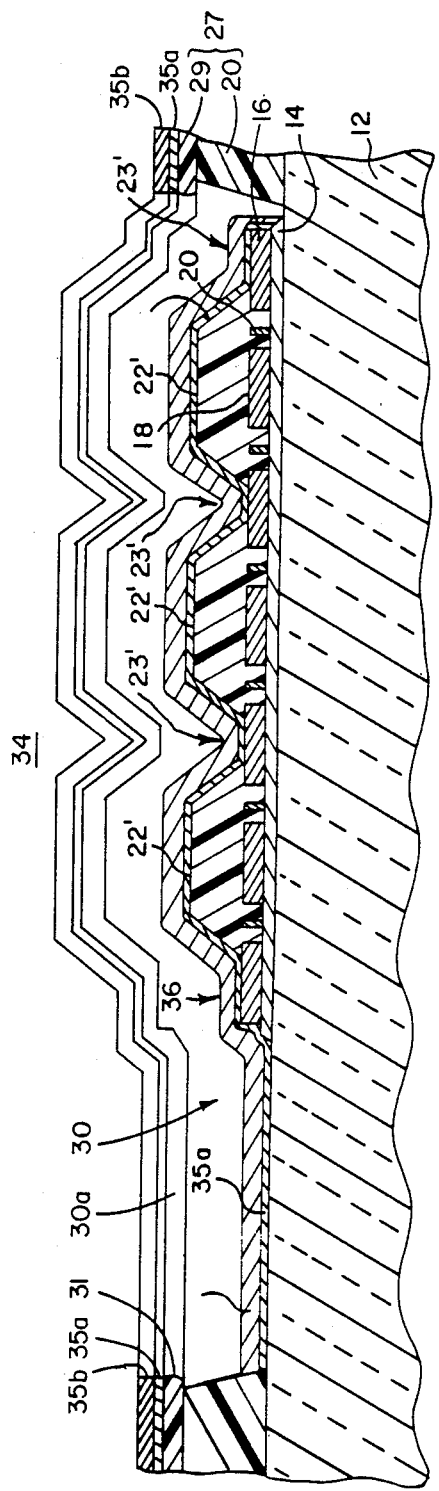

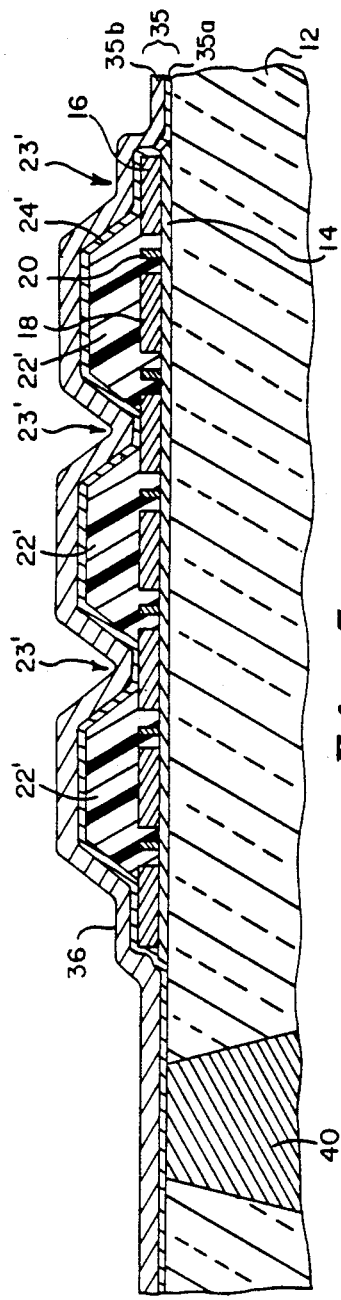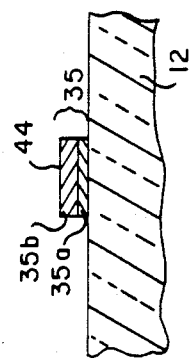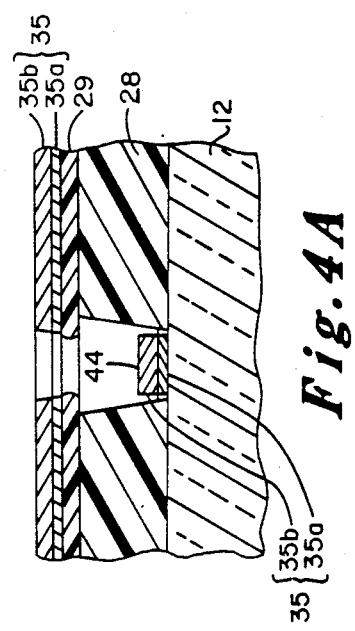

EVAPORATED THICK METAL AND AIRBRIDGE INTERCONNECTS AND METHOD OF MANUFACTURE

BACKGROUND OF THE INVENTION

This invention relates generally to semiconductors, and more particularly, to fabrication of conductors for semiconductor circuits.

As is known in the art, thick metal layers are often employed in semiconductors and monolithic microwave integrated circuits as patterned strip conductors for transmission lines and airbridge interconnects. While a strip conductor for a transmission line generally is disposed on a substrate, an airbridge interconnect which may be a strip conductor for a transmission line generally has a portion disposed in a plane elevated over the substrate. Typically, an airbridge portion of a strip conductor is used to isolate such a strip conductor from an underlying conductor or other circuit element. Airbridges are commonly used as interconnects for source electrodes in certain types of field effect transistors, as interconnects for interdigitated monolithic strip conductor couplers, and as overlays to isolate a pair of crossing strip conductors.

In particular, when forming a so-called airbridge interconnect for isolating a pair of crossing conductors, for example, a first layer of masking material is provided over the substrate and underlying first conductor and is patterned to provide a masked portion over the first conductor. This masked portion defines a region over which the elevated airbridge portion of the airbridge interconnect is provided. A thin, generally, composite metal layer is next evaporated over the masked portion and over the substrate. This thin metal layer provides a continuous conductive surface for subsequent electroplating of the airbridge interconnect, as well as, any other patterned strip conductors. A second photoresist layer is then provided over the continuous conductive layer and is patterned to provide an opening for the airbridge interconnect, that is, masking the first unerlying conductor while simultaneously exposing the previously patterned masked portion used to define the airbridge. The second resist layer is further patterned to provide openings for the other patterned strip conductors. The substrate having the masking layers and the thin metal layer is then placed in an electroplating solution. Typically gold is electroplated within the patterned regions of the second masking layer, adhering to or plating up on exposed portions of the thin metal layer. The plated gold, however, does not plate to the unpatterned portions of the second photoresist layer. After the metal has been electroplated to a predetermined thickness, the top resist layer is removed, the thin evaporated layer is removed in unplated areas, and the masked region used to define the bridge portion is also removed.

While this plating technique for providing airbridge interconnects is acceptable, nevertheless, the above arrangement does have several problems. One problem is that plated metal has a relatively large grain size and consequently a relatively higher radio frequency resistivity. High resistivity particularly at microwave frequencies increases conductor losses which may reduce or degrade r.f. performance. A second problem with plating airbridges is that the second patterned masking layer has a tendency to float or breakdown during an extended plating operation. This breakdown is caused by the plated metal pushing against the masking pattern during the electroplating step. Masking layer breakdown causes the plated conductor to lift-off the substrate, have poorly defined edge surfaces, as well as, results in creeping of the metal beyond the region defined by the pattern masking layer. This breakdown problem often results in aborted plating runs. A third problem with plated overlays is that surface and edge portions of the plated conductors have morphological characteristics which are generally irregular, jagged or rough. This morphology due partly to the above-mentioned problem of mask breakdown as well as other causes limits the minimum spacing which may be provided between conductors, as well as, provides relatively poor radio frequency performance in certain applications. Further, since the devices are placed in a plating solution, the concentration of the metal in the plating solution varies with the extent of use. Accordingly, run to run uniformity between different wafers of the semiconductor elements is generally poor. The above problems, therefore, may limit the usefulness of electroplating airbridges and other conductors in a large scale production environment.

SUMMARY OF THE INVENTION

In accordance with the present invention, a conductor having a pair of portions disposed on a support surface and a portion intermediate the pair of portions elevated over the support surface is provided. A first masked region is provided on the support surface. A second masking layer is provided over the first masked region, and is patterned to provide a first aperture exposing the first masked region and selected portions of the support surface adjacent to the first masked region. The second masking layer may be further patterned to provide a second aperture for a patterned strip conductor. A first portion of the second masked layer is undercut to provide upper portions of the masked layer overhanging into each of said first and second apertures. A stream of evaporated conductive material is directed toward the second masking layer and is deposited over the first masked region and selected adjacent, exposed portions of the support, to provide the conductor having the pair of portions disposed on the support and an intermediate portion disposed in elevation over the support, as well as, a patterned strip conductor. The metal is evaporated to provide conductors having a thickness generally in excess of 1 micron. With this arrangement, by evaporating a thick layer of conductive material to form the strip conductor and the so-called "airbridge interconnect", the problems generally associated with plated or electroplated strip conductors and airbridge interconnects are eliminated. The morphology of the evaporated metal is substantially smoother than that of the plated metal having a grain size which is substantially smaller than the grain size of plated metal. Further, edges of the evaporated conductors and airbridge interconnect conductors are substantially regular, having substantially sharp corners and substantially smooth surface portions. Furthermore, since there is no tendency for the masking layers to float or lift during the evaporation process, the conductors are formed in substantially complete contact and registration with the substrate. Accordingly, the spacing between the conductors may be reduced, and the conductors will provide relatively good radio frequency performance when compared to prior techniques. Furthermore, since the evaporation process is a continuous process, there is more run to run uniformity between different wafers of the same semiconductor elements. Accordingly, this technique may be particularly useful in providing airbridge interconnects and pattern strip conductors in a large scale production environment.

BRIEF DESCRIPTION OF THE DRAWINGS

The foregoing features of the invention, as well as the invention itself, may be more fully understood from the following detailed description of the drawings, in which:

FIGS. 1-5 are cross-sectional views showing steps in fabrication of a field effect transistor having an airbridge source electrode interconnect conductor fabricated in accordance with the present invention;

FIGS. 3A-5A are cross-sectional views showing steps in the fabrication of a patterned strip conductor in accordance with the present invention;

FIG. 3B is a cross-sectional view taken along line 3B of FIG. 3;

DESCRIPTION OF THE PREFERRED EMBODIMENTS

Fabrication of an airbridge interconnect 36 (FIGS. 5, 6) for a multi-cell field effect transistor 10 (FIG. 6) and a strip conductor 44 for a microstrip transmission line 48 (FIGS. 5A, 6) will be described in conjunction with the cross-sectional views of FIGS. 1-5 and 3A-5A, respectively.

Figure 6:
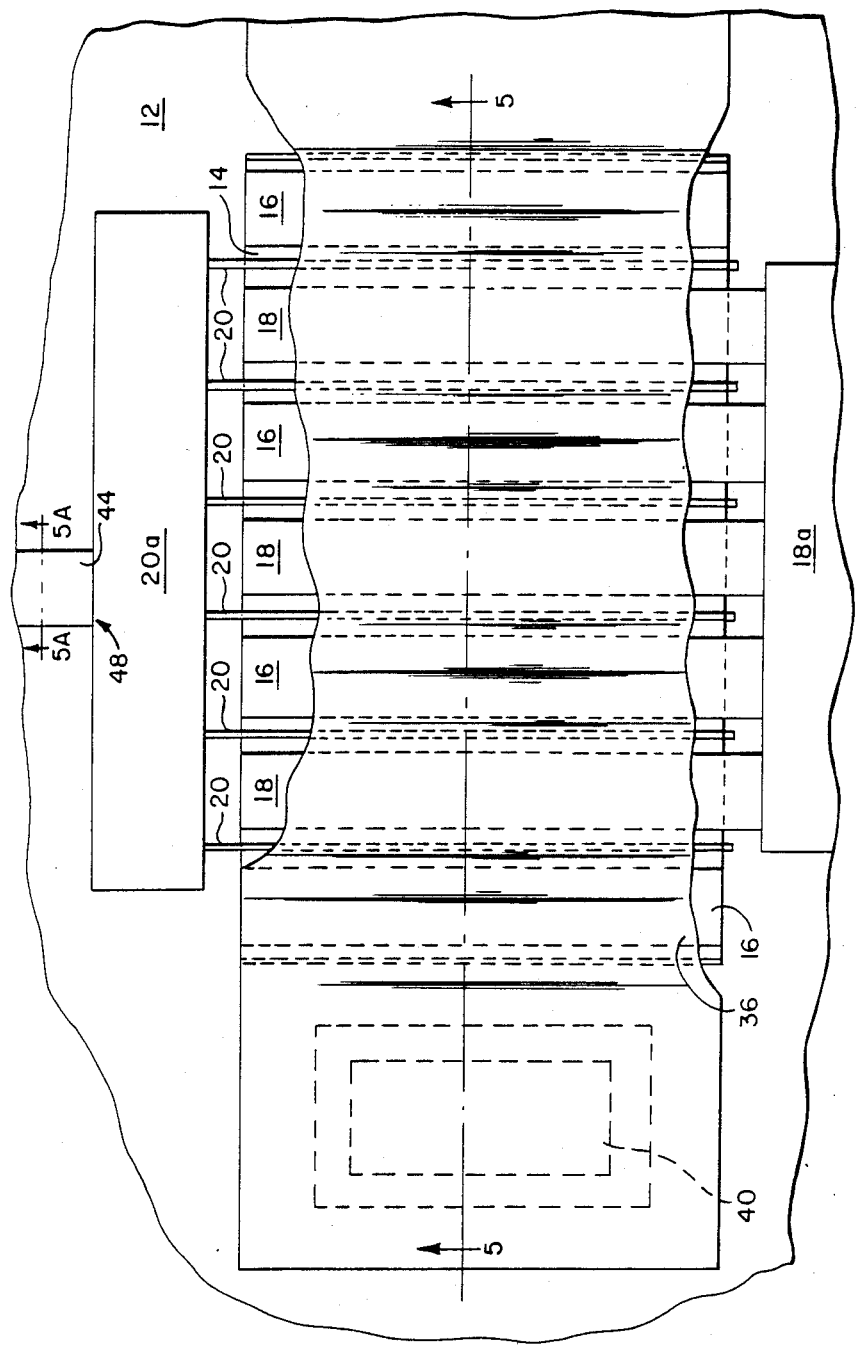
FIG. 6 is a plan view of the field effect transistor of FIG. 5 having a grounded source overlay fabricated in accordance with FIGS. 1-5, and a pattern strip conductor fabricated in accordance with FIGS. 3A-5A.

Referring first to FIG. 1, a substrate 12, here comprising a suitable semiconductor type material such as a Group III-V material system of gallium arsenide, for example, is shown to include an epitaxially grown mesa-shaped active layer 14 provided over an upper surface thereof. Disposed over the active layer 14 are a plurality of source electrodes 16, and a plurality of drain electrodes 18 connected to a common drain pad 18a (FIG. 6). Source electrodes 16 and drain electrodes 18 are suitably spaced by a plurality of gate electrodes 20, with the gate electrodes connected to a common gate pad 20a (FIG. 6). Source electrodes 16 and drain electrodes 18 are formed in ohmic contact with the active layer 14 and gate electrodes 20 are formed in Schottky barrier contact with the active layer 14, as is known in the art. Alternatively, active layer 14 may comprise an ion implanted region within the substrate 12. A masking layer (not numbered) is disposed over the substrate 12 and active region 14, and is patterned to provide masking portions 22 over each one of said drain electrodes 18, adjacent gate electrodes 20, and selected peripheral portions of source electrodes 16 providing apertures 23 which expose central portions of source electrodes 16, as shown. AZ-1375 type of photoresist manufactured by Shipley Company, Newton, Mass. which is responsive to low energy or "near ultraviolet (UV) radiation" and when developed is opaque to high energy or "deep UV radiation" is here used for the masking portions 22.

Other masking materials having suitable characteristics may also be used. Here the masking layer from which masking portions 22 are provided has a thickness typically of 3 microns to provide relatively high airbridges over the underlying conductors and to reduce interelectrode capacitance between the airbridge and an underlying conductor, here the drain electrodes 18 and gate electrodes 20. Here the masking layer is patterned using a contact type of patterning technique to provide the masking portions 22 having relatively steep sidewall portions 24, as shown.

Referring now to FIG. 2, masking portions 22' are shown having sloping sidewall portions 24'. Sloping sidewall portions 24' are here provided from the steep sidewall portions 24 of FIG. 1 by exposing the masking portions 22 (FIG. 1) to a relatively high temperature to cause the masking material of masking portions 22 (FIG. 1) to melt and flow thus providing the masking portions 22' having the aforementioned sloped sidewalls 24'. For the AZ-1375 resist, the temperature is typically in the range 120° C. to 170° C., preferably 130° C. to 150° C. for typically 30 minutes. The sloped sidewalls 24' are used to provide sufficient coverage of metal over the masking regions 22' when forming airbridges as will now be described.

Referring now to FIGS. 3 and 3B, the substrate 12 is provided with a plurality of sequentially deposited and cured masking layers (not numbered) to provide a relatively thick masking layer generally denoted as 28. Layer 28, typically 3.5 microns thick, comprises a photoresist commonly referred to as polymethyl methacrylate (PMMA). PMMA is chosen for the bottom layer since it is sensitive to deep ultra-violet radiation (UV) and has a relatively high resolution and aspect ratio. However, other types of resists which are similarly sensitive to deep UV radiation may alternatively be used. The composite masking layer 27 further includes a relatively thin masking layer 29 of a second type of resist, here an AZ 1350B type by Shipley Company, typically 0.5 microns thick. The composite masking layer 28 is patterned to provide an aperture 30 having overhanging sidewall portions 31. The pattern is provided as follows: A selected portion of masking layer 29 is patterned using either a near UV contact or projection mask alignment system to provide an exposed portion of masking layer 29. The exposed portion of the masking layer 29 is removed using a suitable developer, here an AZ type to provide a first aperture 30a in masking layer 29. Aperture 30a and remaining portions of masking layer 29 here serve as a portable conformable mask for the underlying masking layer 28. It should be noted that the span of the airbridge is determined by the length $l_{22'}$ (FIG. 3) of masking region 22', but the width of the conductor formed over the airbridge is determined by the width $w_{30}$ (FIG. 3B) of the composite aperture 30. Accordingly, the width of masking region 22' is generally larger than the width $w_{30}$ of aperture 30. Further, the composite masking layer 27 generally follows the contour of the underlying masking region 22', active layer 14 and source electrode 16, as shown. As previously mentioned, masking layer 29 is selected to be opaque to deep ultra-violet radiation. Accordingly, the thickness of masking layer 29 is selected to provide sufficient opacity to said radiation. Aperture 30a, however, exposes underlying portions of masking layer 28 which are activated by a blanket exposure to the deep ultra-violet radiation. The masking layer 28 is cured and is developed in a suitable developer, here chlorobenzene. The chlorobenzene is used to overdevelop masking layer 28 providing aperture 30b having sloping sidewall portions 30b' which undercut the upper masking layer 29 thereby providing the aforementioned overhanging sidewall portions 31 (FIGS. 3, 3B). Apertures 30a and 30b thus provide the composite aperture 30.

As shown in FIG. 3A, in a similar manner, the composite mask 27 is further patterned in a different region to provide apertures 26a, 26b providing a composite aperture 26 and forming overhanging portions 29b to provide a pattern for a strip conductor 44 for a microstrip transmission line 48 (FIGS. 4A, 5A and 6).

Referring now to FIGS. 4 and 4A, here successive layers 35a, 35b of evaporated titanium and gold, respectively, providing a composite layer 35 are deposited over masking layer 29 and through composite apertures 26, 30 onto substrate 12, source contacts 16 and over masked regions 22, forming strip conductor 44 (FIG. 4A) for a microstrip transmission line 48 (FIG. 6), and the airbridge interconnect 36 (FIG. 6) for source electrodes 16. Typically, with a Group III-V material system such as GaAs, a thin (100Å-500Å) adherent layer is provided over the GaAs substrate prior to depositing gold. The adherent layer here of titanium 35a is deposited, more particularly, evaporated through composite apertures 26, 30, over the exposed GaAs and source electrodes 16. The titanium layer 35a adheres to the GaAs substrate 12 and permits the subsequent evaporated gold layer 35b to adhere to the titanium layer 35a. The overhanging portions 29a, 29b and contoured portion of composite masking layer 29 provide separation between the metal layer 35 deposited over masking layer 28 and the metal layer 36 deposited on substrate 12 and over masked regions 22. The composite metal layer 35 is deposited from a stream 34 of evaporated metal to any desired thickness, typically of the order of 0.5-5 microns, more preferably, in the range of 1-3 microns.

Referring now to FIGS. 5, 5A and 6, masking layers 28 and 29 (FIGS. 4, 4A), as well as, metal layer 35 provided over masking layer 29 are removed by dissolving masking layers 28 and 29 in acetone. Since metal layer 35 is supported by masking layers 28 and 29, removal or lift-off of masking layers 28 and 29 simultaneously removes the metal layer 35. Masked regions 22 disposed under the airbridge overlay portions of the metal layer or airbridge interconnect pattern 36 are removed by an oxygen plasma etch leaving the strip conductor 44 and the airbridge interconnect pattern 36. A plated via 40 may be provided through substrate 12 to interconnect the airbridge interconnect pattern 36 with a ground conductor (not shown) disposed on the bottom surface of substrate 12.

Figure 7A:
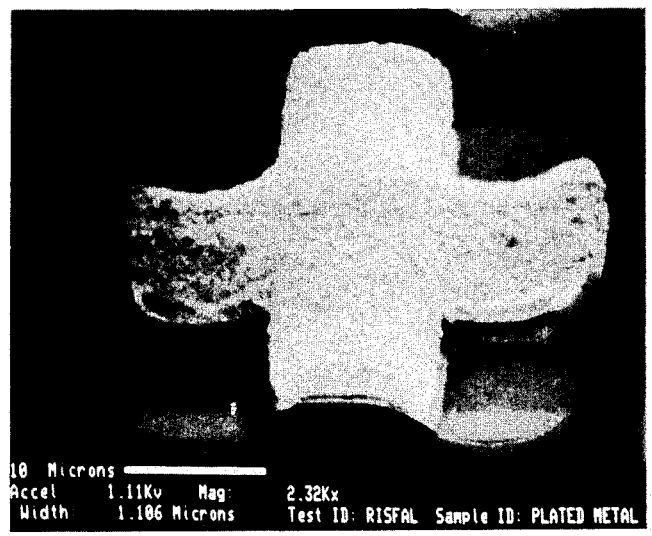
FIGS. 7A-7E are photomicrographs showing the morphological characteristics of plated structures of the prior art.
Figure 7B:
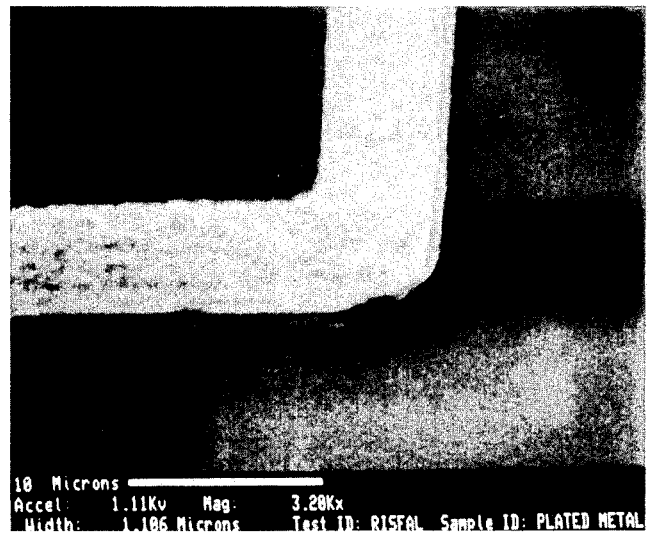
Figure 7C:
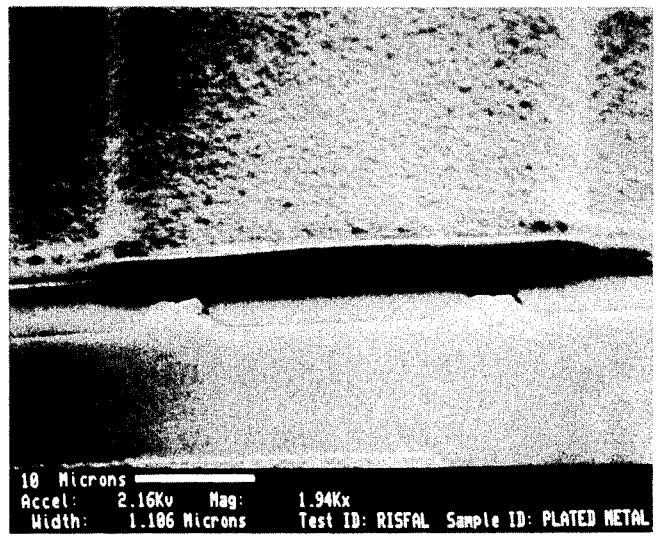
Figure 7D:
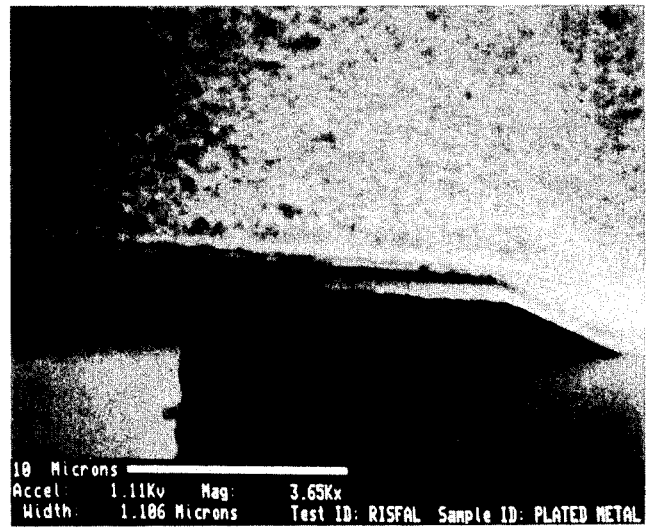
Figure 7E:
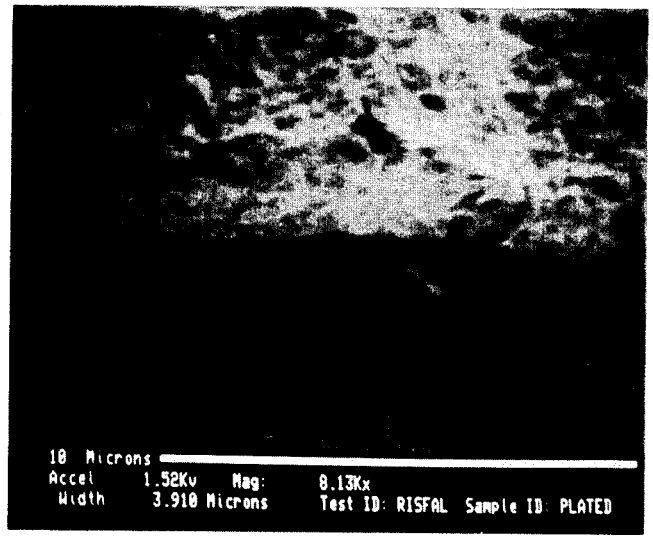

Referring now to FIGS. 7A-7E, typical structures fabricated by conventional plating techniques on GaAs substrates are shown. For example, an alignment marker is shown in FIG. 7A as fabricated by plating metal within a patterned mask region. As can be seen, the surface morphology of the plated metal is substantially rough and nonuniform, and the plated metal has a relatively large grain size. Furthermore, end portions of the alignment marker are lifted off of the substrate. As shown in FIG. 7B, a portion of a strip conductor has a similar surface morphology as the alignment marker of FIG. 7A, and has an outside corner portion lifted off of the substrate. As shown in FIGS. 7C-7E, consecutively increasing magnification views of a source overlay structure for a field effect transistor are shown. Again, the source overlay structure has a morphology similar to that of FIGS. 7A and 7B, that is, the surfaces are substantially rough or jagged and the metal has a relatively large grain size. Furthermore, as shown particularly in FIG. 7E, the edge definition of the plated overlay structure is substantially irregular, jagged and rough.

Figure 8A:
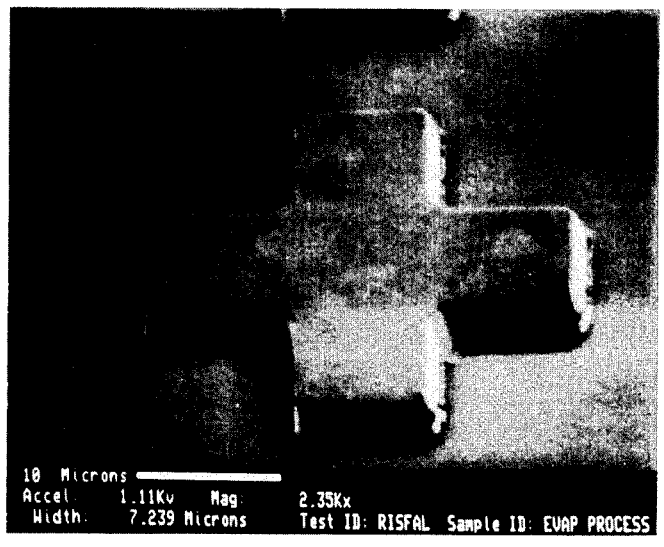
FIGS. 8A-8E are photomicrographs showing the morphological characteristics of structures fabricated in accordance with the present invention.
Figure 8B:
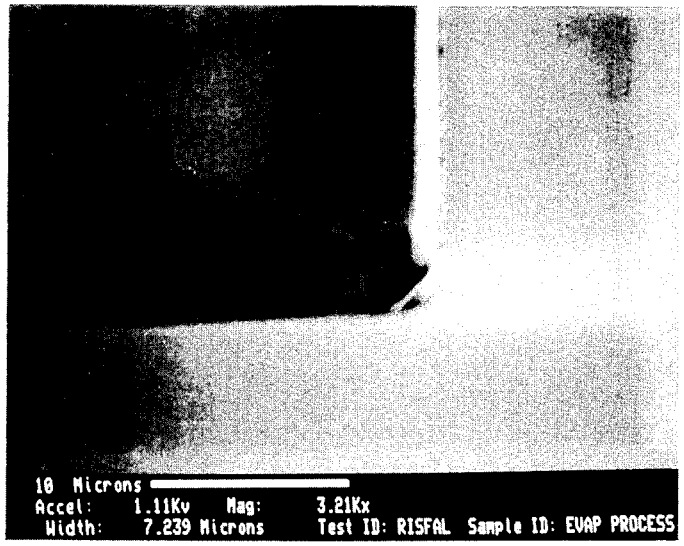
Figure 8C:
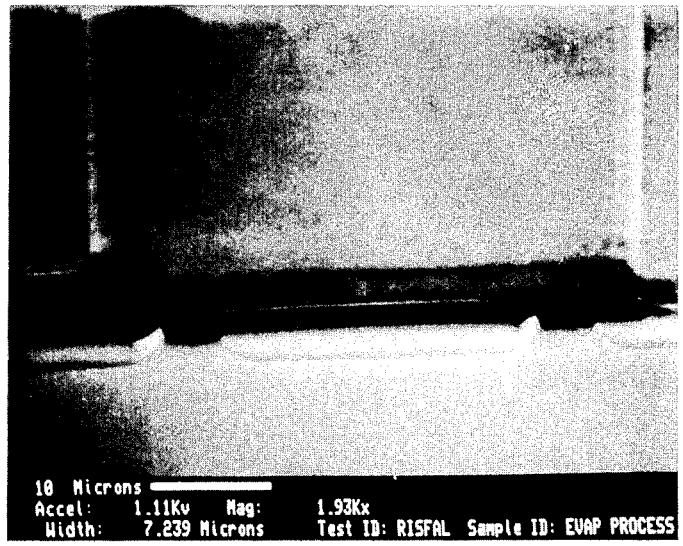
Figure 8D:
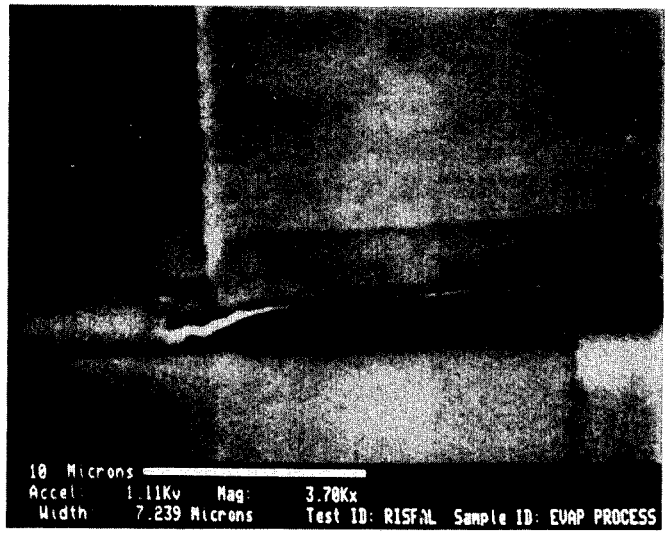
Figure 8E:
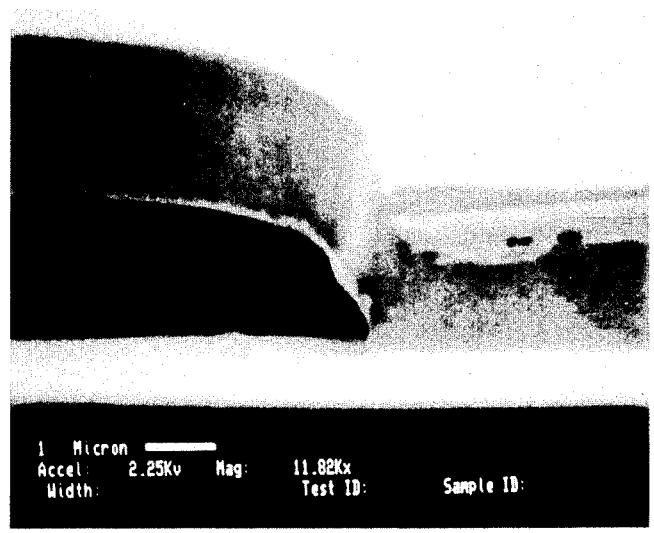

Referring now to FIGS. 8A-8E, corresponding components fabricated on a GaAs substrate in accordance with the teachings of the present invention are shown. The cross-type alignment marker as shown in FIG. 8A fabricated in accordance with the present invention has a substantially smooth and uniform surface, and the end portions of the alignment markers are attached to and disposed upon the substrate. Further, end portions and edges of the alignment markers are substantially smooth, uniform and have substantially sharp corners. As shown in FIG. 8B, a strip conductor has a substantially smooth and uniform surface, and has corner portions attached and disposed upon the support structure. As shown in conjunction with FIGS. 8C-8E, an evaporated airbridge overlay has a substantially uniform and smooth surface morphology. As shown in FIG. 8E, the step coverage of the airbridge over the underlying gate electrode conductor is substantially smooth and uniform. The grain size of the evaporated metal shown in FIGS. 8A-8E is also substantially smaller than that of the plated metal of FIGS. 7A-7E. Typically, the grain size of the plated metal particularly in the vertical direction is of the order of 1-3 microns, whereas, the grain size of evaporated metal is of the order of 100 Angstroms.

Accordingly, structures fabricated in accordance with the present invention will have substantially uniform surface morphology features, substantially regular and sharp defined edge surfaces, and furthermore, will have lower radio frequency resistivities due to the small grain size of evaporated metal. Thus, these structures will permit more predictable r.f. performance due to the uniform shape, and will permit tighter spacing between adjacent conductors.

Having described preferred embodiments of the invention, it will now be apparent to one of skill in the art that other embodiments incorporating its concept may be used. It is felt, therefore, that this invention should not be restricted to the disclosed embodiments, but rather should be limited only by the spirit and scope of the appended claims.

What is claimed is:

1. A method of forming a strip conductor having a pair of portions disposed on a support surface and a portion intermediate the pair of supported portions disposed over the support surface comprises the steps of:

providing a masked region on the support surface;
    providing a masking layer over the support surface and masked region;
    patterning the masking layer to provide an aperture exposing the masked region and selected portions of the support surface adjacent to the masked region while undercutting a bottom portion of the masking layer to provide an upper portion of said masking layer overhanging into said aperture; and
    evaporating a conductive material over the masked region, adjacent selected portions of the support surface, and masking layer to provide the conductor, with the overhanging portions of the masking layer separating the conductor from the conductive material evaporated over the masking layer.

2. The method of claim 1 further comprising the step of removing the masking layer, the conductive material over the masking layer and the masked region.

3. The method of claim 2 wherein the conductive material is evaporated to a thickness of at least about 0.5 microns.

4. A method of forming a strip conductor having a pair of portions disposed on a support surface and a portion intermediate the pair of supported portions disposed in elevation over the support surface comprises the steps of:
 providing a first masking layer on the support surface and patterning said masking layer to provide a first masked region on the support surface;
 providing a second masking layer on the support surface and over the first masked region;
 providing a third masking layer over the second masking layer;
 patterning the second and third masking layers to provide an aperture exposing the first masked region and selected portions of the support surface adjacent to the first masked region while undercutting the second masking layer to provide a portion of the third masking layer overhanging into the aperture provided in the second masking layer; and
 providing a stream of directed conductive material over the masked region and adjacent selected portions of the support surface to provide the conductor.

5. The method of claim 4 wherein said first masked region is provided with sloped sidewall portions.

6. The method of claim 5 wherein the second masking layer is sensitive to a first wavelength range of optical electromagnetic energy and the third masking layer is sensitive to a second, different wavelength range of optical electromagnetic energy and is substantially opaque to said first wavelength range.

7. The method as recited in claim 6 wherein the directed conductive material is provided by evaporating conductive material over the masked region and adjacent selected portions of the support surface.

* * * * *